United States Patent
Kim et al.

(10) Patent No.: US 9,762,119 B2
(45) Date of Patent: Sep. 12, 2017

(54) SWITCH DRIVING CIRCUIT, AND POWER FACTOR CORRECTION CIRCUIT HAVING THE SAME

(71) Applicants: SAMSUNG ELECTRONICS CO., LTD., Suwon-si, Gyeonggi-do (KR); SNU R&DB FOUNDATION, Seoul (KR)

(72) Inventors: Jin Han Kim, Suwon-si (KR); Han Sol Seo, Seoul (KR); Bo-Hyung Cho, Seoul (KR); Sang-Woo Kang, Seoul (KR); Paul Jang, Seongnam-si (KR)

(73) Assignees: SAMSUNG ELECTRONICS CO., LTD., Suwon-si (KR); SNU R&DB FOUNDATION, Seoul (KR)

( * ) Notice: Subject to any disclaimer, the term of this patent is extended or adjusted under 35 U.S.C. 154(b) by 10 days.

(21) Appl. No.: 14/965,346

(22) Filed: Dec. 10, 2015

(65) Prior Publication Data

US 2016/0285353 A1    Sep. 29, 2016

Related U.S. Application Data

(60) Provisional application No. 62/139,141, filed on Mar. 27, 2015.

(30) Foreign Application Priority Data

Aug. 18, 2015 (KR) .......................... 10-2015-0116091

(51) Int. Cl.
*H03K 17/687* (2006.01)
*H02M 1/42* (2007.01)
(Continued)

(52) U.S. Cl.
CPC ....... *H02M 1/4208* (2013.01); *H02M 1/4225* (2013.01); *H03K 17/162* (2013.01); *H03K 17/302* (2013.01); *Y02B 70/126* (2013.01)

(58) Field of Classification Search
None
See application file for complete search history.

(56) References Cited

U.S. PATENT DOCUMENTS 6,154,081 A * 11/2000 Pakkala ........... H03K 17/08142
327/309
6,614,633 B1 * 9/2003 Kohno ................ H01L 27/0266
361/111
(Continued)

FOREIGN PATENT DOCUMENTS

JP         8-9659      1/1996
JP      2008-70680     3/2008

*Primary Examiner* — Cassandra Cox
(74) *Attorney, Agent, or Firm* — Staas & Halsey LLP

(57) ABSTRACT

The present disclosure relates generally to a switch driving circuit and power factor correction circuit having the same, and more particularly, to a technology to provide a negative offset using Zener diodes to prevent malfunctions in driving a switch. The switch driving circuit to operate a switch implemented with a Field Effect Transistor (FET) includes a first Zener diode connected to a control input end of the switch; a capacitor connected in parallel with the first Zener diode; and second and third Zener diodes for providing a negative offset to fix a voltage applied between the gate and source of the switch to a negative value.

23 Claims, 8 Drawing Sheets

(51) Int. Cl.
*H03K 17/16* (2006.01)
*H03K 17/30* (2006.01)

(56) References Cited

U.S. PATENT DOCUMENTS

| | | | |
|---|---|---|---|
| 8,395,422 B2 * | 3/2013 | Ogawa | H03K 17/04123 327/109 |
| 8,847,235 B2 * | 9/2014 | Rose | H03K 17/08122 257/76 |
| 2006/0044046 A1 | 3/2006 | Bird et al. | |
| 2009/0184744 A1 * | 7/2009 | Ricotti | H03K 17/04206 327/218 |
| 2012/0262220 A1 * | 10/2012 | Springett | H03K 17/04206 327/430 |
| 2014/0241015 A1 * | 8/2014 | Barauna | H02M 3/156 363/37 |
| 2014/0320194 A1 * | 10/2014 | Rozman | H03K 17/167 327/382 |

* cited by examiner

SWITCH DRIVING CIRCUIT, AND POWER FACTOR CORRECTION CIRCUIT HAVING THE SAME

CROSS-REFERENCE TO RELATED APPLICATIONS

This application claims the benefit under 35 U.S.C. §119 (a) of a U.S. provisional patent application filed on Mar. 27, 2015 in the US Patent and Trademark Office and assigned Ser. No. 62/139,141 and claims benefit of foreign priority to Korean patent application filed on Aug. 18, 2015 in the Korean Intellectual Property Office and assigned Ser. No. 10-2015-0116091, the entire disclosures of which are incorporated hereby incorporated by reference.

BACKGROUND

1. Field

The present disclosure relates generally to a switch driving circuit and power factor correction circuit having the same, and more particularly, to a technology to provide a negative offset using Zener diodes to prevent malfunctions in driving a switch.

2. Description of Related Art

The power factor of an Alternate Current (AC) electrical power system is defined as the ratio of the real power flowing to the load to the apparent power.

This is also referred to as PF. For instance, a power factor of an AC power system having sinusoidal current and voltage waveforms is equal to the cosine of a phase angle between the current and voltage waveforms. For power calculation of a Direct Current (DC) circuit, the power is simply given by a product of current and voltage, but for power calculation of AC power, the power has to be obtained by multiplying effective values of the voltage and current by a coefficient, $\cos\theta$ except for an instance where the current and voltage are in phase. A power factor of an AC power system having non-sinusoidal current or voltage waveform includes several factors, including a displacement factor related to the phase angle and a distortion factor related to the non-sinusoidal waveform.

In general, the real power (e.g., in watts) may be defined as the power that is actually used to do work; the reactive power may be defined as the power required to produce a magnetic field (e.g., consumed power) to do actual work; and the apparent power may be defined as a total power required to produce desired real power. The power factor of an AC power system may vary in the range from 0 to 1, and when the power factor is 1, it represents a pure resistive circuit without reactive power loss. When the power factor of an AC power system is not equal to 1, a current waveform may not follow the voltage waveform, thereby potentially causing power loss as well as occurrence of harmonics that pass the AC power system, which interferes with other devices. It is rare for the load that is connected to a power source to only have pure resistance components, but the load often has a capacitive or inductive components, which cause reactive power loss. Especially, in case of converting AC power to DC power for use, a smoothing capacitor is used to reduce the AC components, which may cause the power factor to be reduced. To reduce the reactive power loss, many types of power factor enhancement circuits that make the input voltage and current almost be in phase are used, and especially in an apparatus that converts AC power to a DC voltage for use, a power factor enhancement scheme with a boost converter is often used.

Accordingly, the power factor of an AC power system may increase by means of a power factor correction circuit (or PFC circuit).

The PFC circuit includes a bridgeless PFC circuit, a semi-bridgeless PFC circuit, a totem-pole bridgeless PFC circuit, etc.

SUMMARY

The present disclosure provides a switch driving circuit and power factor correction circuit having the same, which provides a negative offset using a Zener diode to prevent circuit damage due to malfunctions in driving a switch.

In accordance with an aspect of the present disclosure, a switch driving circuit is provided. The switch driving circuit to operate a switch implemented with a Field Effect Transistor (FET) includes a first Zener diode connected to a control input end of the switch; a capacitor connected in parallel with the first Zener diode; and second and third Zener diodes for providing a negative offset to fix a voltage applied between the gate and source of the switch to a negative value.

The second and third Zener diodes may be connected back-to-back between the gate and source of the switch.

The first Zener diode may be configured to charge the capacitor with a voltage of a level that corresponds to the ratings of the first Zener diode based on the level of a switch driving voltage to turn on the switch.

The third Zener diode may be configured to have the ratings such that a voltage as much as a result of subtraction of a voltage of a level corresponding to the ratings of the first Zener diode from a level of the switch driving voltage is applied between the gate and source, while the switch is turned on.

The capacitor may remain charged with a voltage of a level corresponding to the ratings of the first Zener diode, if a signal is applied to turn off the switch.

The second Zener diode may be configured to have the ratings such that a voltage corresponding to the level of a charged voltage in the capacitor provides a negative offset fixed to a negative value between the gate and source, while the switch is turned off.

The switch driving circuit may further include a first resistor connected to the anode of the first Zener diode and the gate of the switch for controlling turn-on speed of the switch; and a diode connected to the anode of the first Zener diode and the gate of the switch for controlling turn-off speed of the switch.

The switch driving circuit may further include a second resistor connected between the anode of the diode and gate of the switch and the ground for lowering the voltage between the gate and source.

The switch may be implemented with a gallium oxide (GaN) FET.

In accordance with another aspect of the present disclosure, a totem-pole power factor correction circuit for converting an Alternate Current (AC) voltage to a Direct Current (DC) voltage is provided. The totem-pole power factor correction circuit may include a first Zener diode connected to a control input end of the switch; a capacitor connected in parallel with the first Zener diode; and second and third Zener diodes for providing a negative offset to fix a voltage applied between the gate and source of the switch to a negative value.

The second and third Zener diodes may be connected back-to-back between the gate and source of the switch.

The first Zener diode may be configured to charge the capacitor with a voltage of a level that corresponds to the ratings of the first Zener diode based on the level of a switch driving voltage to turn on the switch.

The third Zener diode may be configured to have the ratings such that a voltage as much as a result of subtraction of a voltage of a level corresponding to the ratings of the first Zener diode from a level of the switch driving voltage is applied between the gate and source, while the switch is turned on.

The capacitor may remain charged with a voltage of a level corresponding to the ratings of the first Zener diode, if a signal is applied to turn off the switch.

The second Zener diode may be configured to have the ratings such that a voltage corresponding to the level of a charged voltage in the capacitor provides a negative offset fixed to a negative value between the gate and source, while the switch is turned off.

The switch driving circuit may further include a first resistor connected to the anode of the first Zener diode and the gate of the switch for controlling turn-on speed of the switch; and a diode connected to the anode of the first Zener diode and the gate of the switch for controlling turn-off speed of the switch.

The switch driving circuit may further include a second resistor connected between the anode of the diode and gate of the switch and the ground for lowering the voltage between the gate and source.

The switch may be implemented with a gallium oxide (GaN) FET.

In accordance with another aspect of the present disclosure, an electronic product equipped with a totem-pole power factor correction circuit including a switch driving circuit for operating a switch implemented with a Field Effect Transistor (FET) is provided. The electronic product includes a first Zener diode connected to a control input end of the switch; a capacitor connected in parallel with the first Zener diode; and second and third Zener diodes for providing a negative offset to fix a voltage applied between the gate and source of the switch to a negative value.

In accordance with another aspect of the present disclosure, a switch driving circuit includes: a field effect transistor; an AC voltage source having a first terminal and a second terminal; a first Zener diode connected to the first terminal of the AC voltage source and having an anode connected to a gate of the field effect transistor; a capacitor connected in parallel with the first Zener diode; a second Zener diode having an anode connected to the gate of the field effect transistor; and a third Zener diode having an anode connected to a source of the field effect transistor and to the second terminal of the AC source, and having a cathode connected to a cathode of the second Zener diode.

In a further aspect of the above circuit, the circuit further includes a resistor connected between the anode of the first Zener diode and the gate of the field effect transistor; a fourth diode connected between the anode of the first Zener diode and the gate of the field effect transistor, and connected in parallel with the resistor, the fourth diode having a higher resistance than that of the resistor for an on current flowing from the anode of the first Zener diode to the gate of the field effect transistor. In another further aspect, the circuit includes a second resistor connected between the anode of the second Zener diode and the anode of the third Zener diode. In another further aspect, when the field effect transistor has been switched from on to off, a negative voltage is applied to the third Zener diode and a negative voltage is applied between the gate and the source of the field effect transistor.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF THE DRAWINGS

The above and other features and advantages of the present disclosure will become more apparent by describing in detail exemplary embodiments thereof with reference to the attached drawings in which.

Throughout the drawings, like reference numerals will be understood to refer to like parts, components, and structures.

DESCRIPTION OF EMBODIMENTS

Figure 1:
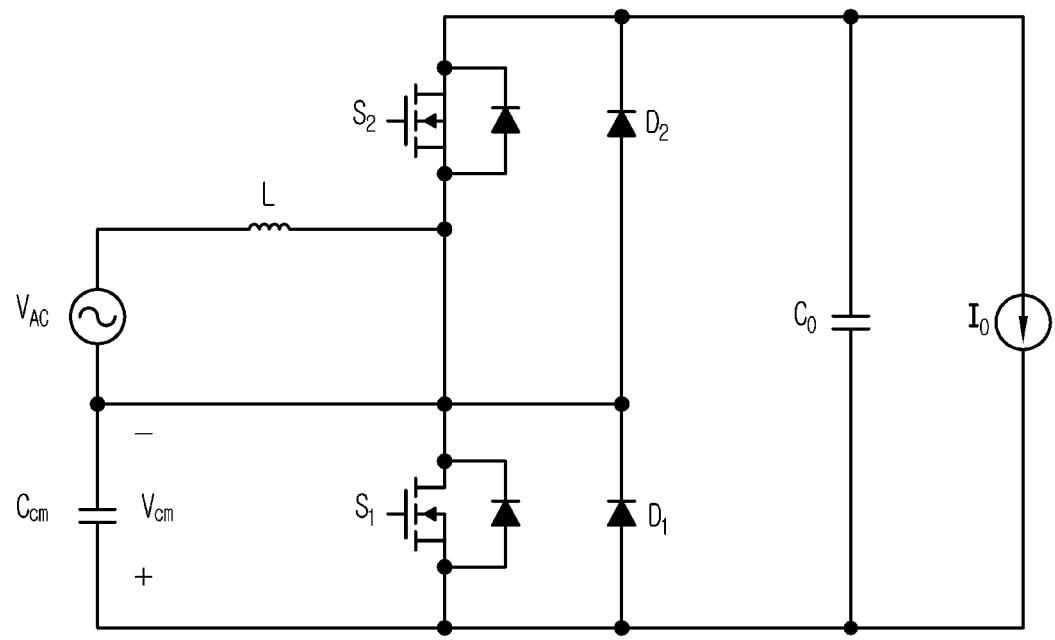
FIG. 1 is a circuit diagram of a totem-pole power factor correction (PFC) circuit, according to an embodiment of the present disclosure.

Reference will now be made in detail to the embodiments, examples of which are illustrated in the accompanying drawings, wherein like reference numerals refer to the like elements throughout. The embodiments are described below to explain the present invention by referring to the figures.

Advantages, features, and methods for achieving them will be understood more clearly when the following embodiments are read with reference to the accompanying drawings.

Embodiments and features as described and illustrated in the present disclosure are only preferred examples, and various modifications thereof may also fall within the scope of the disclosure.

Embodiments of a switch driving circuit and power factor correction (PFC) circuit having the same will be described below. Furthermore, an electronic product equipped with a PFC circuit having the switch driving circuit will also be described. Like reference numerals refer to like components throughout the drawings, and thus the related descriptions that overlap will be omitted. In the description of the present disclosure, if it is determined that a detailed description of commonly-used technologies or structures related to the embodiments of the present disclosure may unnecessarily obscure the subject matter of the invention, the detailed description will be omitted. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

Throughout the following description, the term 'switching device' refers to a wired element to conduct or block current in electric and electronic devices. The switching device may include transistors that conduct current based on a control signal, which may include, but not exclusively to, a bipolar junction transistor (BJT) and a field effect transistor (FET).

In a case that an FET is operated as the switching device, the switching device includes gate, drain, and source terminals. In this case, the drain terminal may act as the source terminal and vice versa, depending on input signals.

Furthermore, the switching device may be classified into a low-voltage switching device (LN) that operates at low voltage and a high-voltage switching device (HN) that operates at high voltage. Especially, the HN is a switching device that may endure even when a high voltage is applied to the drain terminal and that are commonly used in various power devices.

The HN may be a Double-diffused Metal Oxide Semiconductor FET (DMOSFET), an Insulated Gate Bipolar Transistor (IGBT), an Extended Drain MOSFET (EDMOSFET), a Lateral Double-diffused MOSFET (LDMOSFET), a gallium nitride (GaN) transistor, or the like, but is not limited thereto.

Throughout this specification, the expression "turn on" refers to changing a switching device from a non-conductive state to a conductive state. Especially, it means applying a signal to the gate of the switching device to conduct current. On the other hand, the expression "turn off" refers to changing the switching device from a conductive state to a non-conductive state.

The present disclosure is directed to a power factor correction (PFC) circuit, which is commonly used in most electric apparatuses and electronic products including single-phase home appliances such as air conditioners, display driving systems, etc. The single-phase home appliance may include a PFC circuit, an inverter, and a motor, and the display driving systems may include a PFC circuit, a converter, and a load. The PFC circuit used in these systems may correct the power factor of an Alternate Current (AC) input voltage and input current, making a Direct Current (DC) regulated voltage required in the inverter. Power factor regulation is applied in most electric and electronic products, and for this, a PFC circuit is required.

Figure 2:
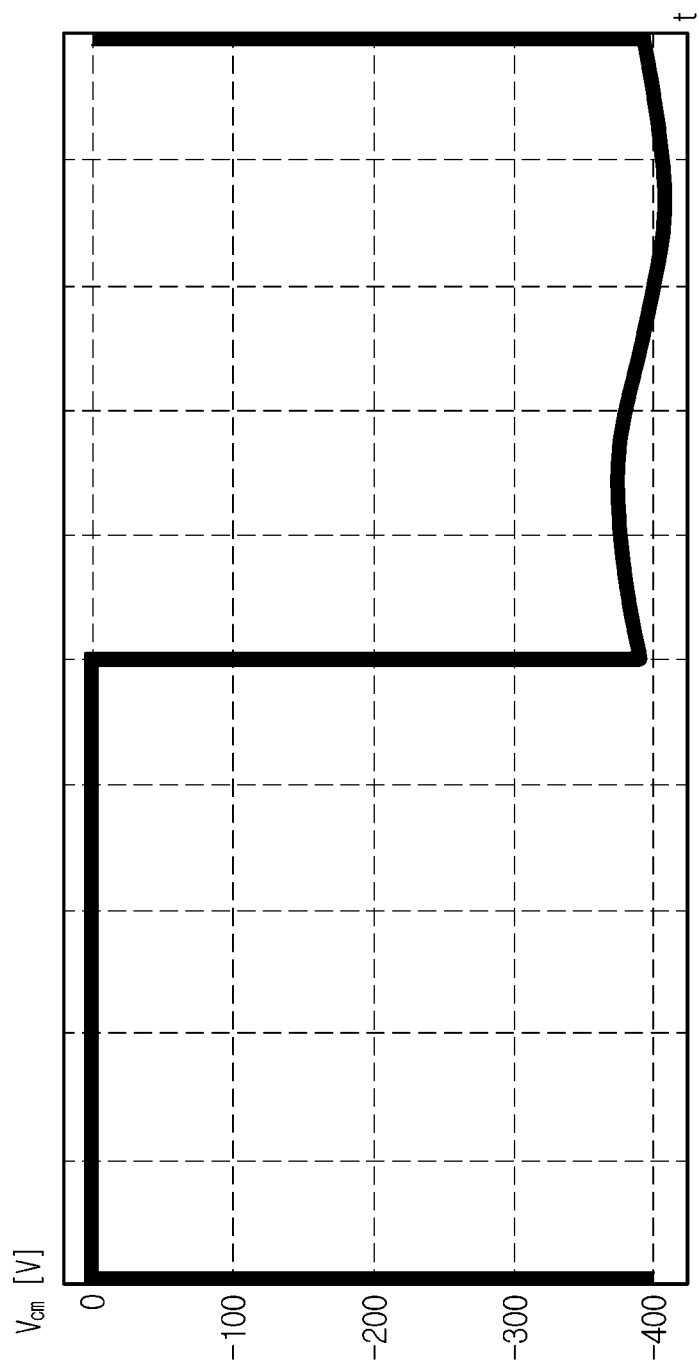
FIG. 2 is a graph showing a waveform of a common mode voltage in a totem-pole PFC circuit, according to an embodiment of the present disclosure.

FIG. 1 is a circuit diagram of a totem-pole PFC circuit, according to an embodiment of the present disclosure, and FIG. 2 is a graph showing a waveform of a common mode voltage in a totem-pole PFC circuit, according to an embodiment of the present disclosure.

Referring to FIG. 1, a totem-pole bridgeless PFC circuit may include an inductor L, a first switching device S1, a second switching device S2, diodes D1, D2, and an output capacitor $C_O$.

The inductor L may be connected to an input AC voltage $V_{AC}$ and at the same time, to the source terminal of the second switching device S2. The drain terminal of the first switching device S1 may be connected to the source terminal of the second switching device S2. Cathode terminals of the diodes D1 and D2 may be connected to the drain terminals of the first and second switching devices S1 and S2, respectively, and the cathode of the diode D2 may also be connected to an end of the output capacitor $C_O$.

A parasitic capacitor refers to a capacitor that has capacitance produced according to various conditions of the circuit. An ordinary capacitor has two opposite metal plates and a dielectric substance inserted between the metal plates, to conduct inductive current when applied with AC. On the other hand, what appears as if there is capacitance between conductors when AC is applied across the conductors is called the parasitic capacitor. In FIG. 1, $C_{cm}$ indicates the parasitic capacitor.

Signals to the gate of the first and second switching devices S1 and S2 have the form of square waves, and the controller may drive the first and second switching devices S1 and S2 using pulse width modulated or pulse frequency modulated gate signals. Pulse Width Modulation (PWM) is a type of a modulation technique, by which an analog signal to be wiredly or wirelessly transmitted is modulated to a noise robust digital signal since the analog signal is susceptible to and likely to be damaged by noise. In other words, the PWM is a scheme for modulating pulse width to an extent to which the analog signal is modulated to the digital value, in which case if an amplitude of the signal is large, the pulse width is large, and if an amplitude of the signal is small, the pulse width is small. Pulse Frequency Modulation (PFM) is a modulation technique to change the repetition frequency of pulses depending on the magnitude of a signal, in which case if the magnitude of the signal is large, the repetition frequency is high, and if the magnitude of the signal is small, the repetition frequency is low. It is conventional to use the aforementioned schemes to control the operation of a switching device.

The first and second switching devices S1 and S2 may be implemented with GaN FETs. Silicon MOSFETs (Si MOSFETs) were mainly used as the switching devices in the past, but nowadays, GaN FETs known as one of next generation power semiconductors are used because they have relatively low on-resistance due to characteristics of wide band gap semiconductors as compared to the conventional Si MOSFETs, thereby minimizing heat generation therefrom. In addition, as compared to Si MOSFETs, GaN FETs have low device capacitance values, are able to perform high-speed switching with short switching turn-on and turn-off time, and have noticeably low switching loss. Accordingly, it is possible to implement a high-efficient PFC circuit by using switching devices implemented with GaN FETs. Furthermore, high-frequency switching of the GaN FET device may lead to reduction in volume of passive devices, which in turn enables circuit deification and maximize performance of the PFC circuit using high reverse recovery characteristics of the GaN FET device.

In the totem-pole bridgeless PFC circuit shown in FIG. 1, the first and second switching devices S1 and S2 may be arranged on one leg of the circuit, and the low-frequency diodes D1, D2 may be arranged on the other leg. With the arrangement, the common mode voltage $V_{cm}$ has zero electric potential when the AC input power has a positive value, and has a DC link voltage when the AC power has a negative value.

The DC link voltage refers to a voltage of a DC circuit, which is in between the converter and the inverter in a main system of a power modulation circuit comprised of a converter and an inverter. That is, the DC link voltage is also called a DC stage voltage across either DC terminals once the AC is converted to the DC.

Accordingly, in the totem-pole PFC circuit, the common mode voltage appears as a square wave voltage of 60 Hz, as shown in FIG. 2, which may improve common mode noise characteristics. In addition, it may also gain high efficiency because no additional device is required and semiconductor devices on the conducting path are the same as in the basic bridgeless scheme.

Figure 3:
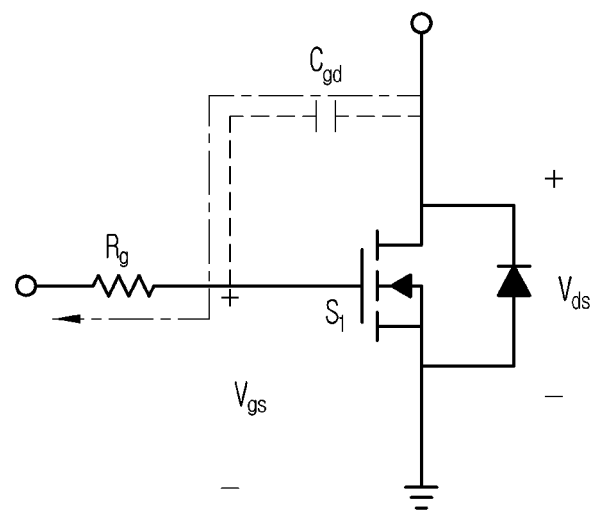
FIG. 3 is a conceptual diagram showing shoot-through current in driving a switch in a totem-pole PFC circuit.
Figure 4:
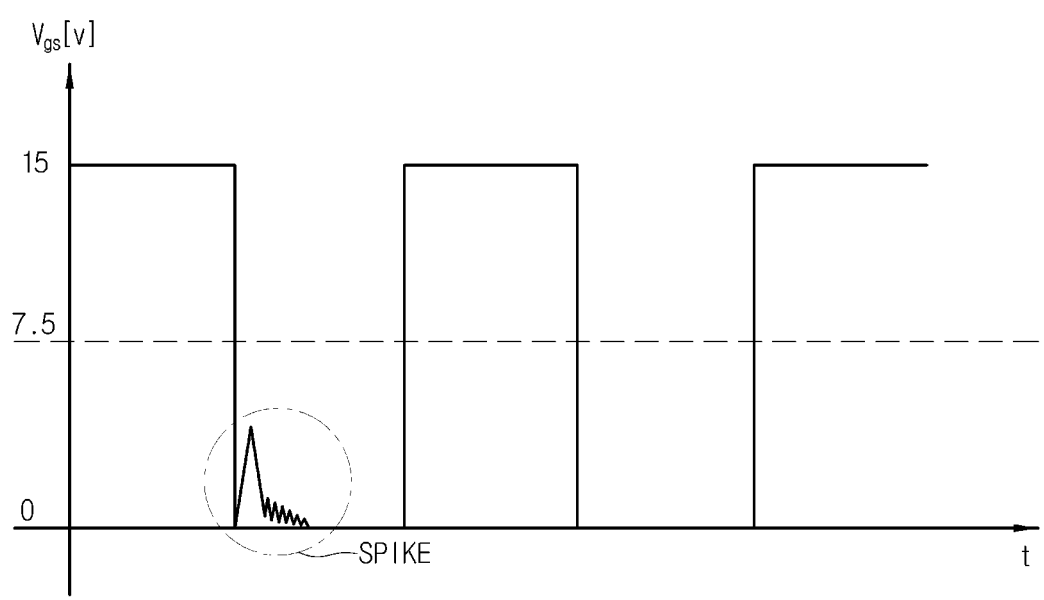
FIG. 4 is a graph showing voltage spikes due to shoot-through current produced in driving a switch.

FIG. 3 is a conceptual diagram showing shoot-through current produced in driving a switch in a totem-pole PFC circuit, and FIG. 4 is a graph showing voltage spikes due to shoot-through current produced in driving a switch.

Although FIG. 3 shows a switch driving circuit for the first switching device S1 in the totem-pole bridgeless PFC circuit as shown in FIG. 1, it may be equally applied for the second switching device S2 as well. Referring to FIG. 3, fast switching characteristics of the GaN FET are beneficial to make the circuit be highly efficient, but on the other hand, noise generated by parasitic components of the GaN FET might arise a problem. Specifically, when switching of the first switching device S1 abruptly changes voltage $V_{ds}$ between the drain and source terminals of the GaN FET switch, a shoot-through current that is induced to flow through parasitic capacitor $C_{gd}$ between the gate and drain terminals of the switch may be produced according to the following equation 1:

$$i = C\frac{dv}{dt} i = C\frac{dv}{dt} \quad (1)$$

From the shoot-through current produced this way, voltage spikes may be caused to the voltage $V_{gs}$ between the gate and source terminals of the switch, as shown in FIG. 3, according to the following equation 2:

$$v = L\frac{di}{dt} \quad (2)$$

Voltage spikes are distorted pulses having very short pulse width compared to the pulse width of the signal, referring to a short-duration voltage or current amplitudes that are produced in switching operation of the circuit. The faster the switching speed of the switching device, the larger the current induced to flow through the parasitic capacitor $C_{gd}$ and the voltage spike induced accordingly.

Referring to FIG. 4, with the voltage $V_{gs}$ of 15V applied between the gate and source terminals of the first switching device S1, the first switching device S1 is turned on, and with $V_{gs}$ of 0V applied, the first switching device S1 is turned off. The voltage level of 15V is only an example, and the voltage level may be adjusted to any other voltage value.

In the case that $V_{gs}$ of 0V is applied, the first switching device S1 may be turned on due to the voltage spike, despite the first switching device S1 having to be turned off. Specifically, if the voltage spike caused to the voltage between the gate and source terminals $V_{gs}$ of the first switching device S1 is greater than a threshold voltage of the first switching device S1, malfunction of the switching device may be induced.

Accordingly, if the first and second switching devices S1 and S2 are all turned on due to the voltage spike, an arm short phenomenon may be induced to damage the switching devices. To solve the problem, a switch driving circuit for providing a negative offset is required.

Figure 5:
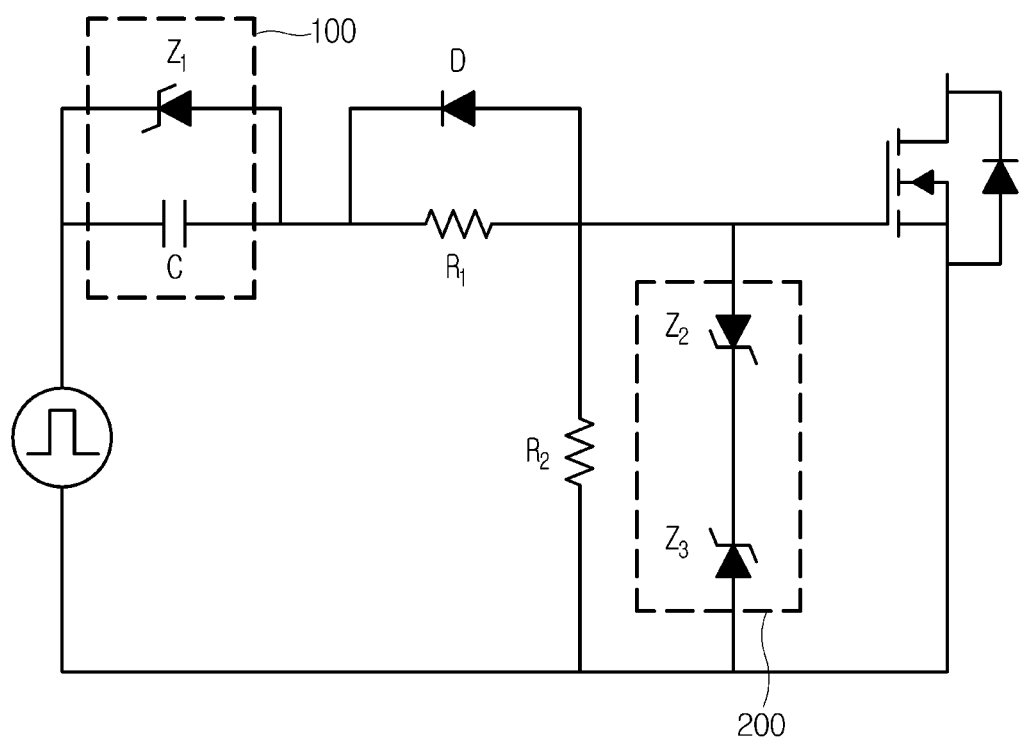
FIG. 5 is a circuit diagram of a switch driving circuit of a first switching device, according to an embodiment of the present disclosure.
Figure 6:
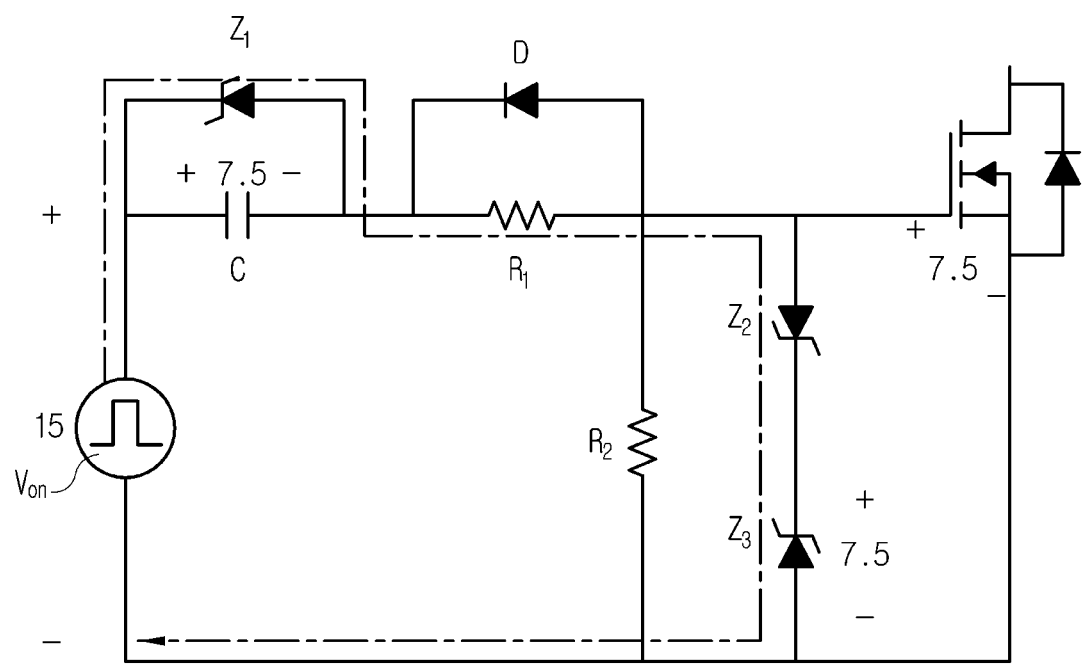
FIG. 6 is a conceptual diagram for providing a negative offset while a first switching device is turned on, according to an embodiment of the present disclosure.
Figure 7:
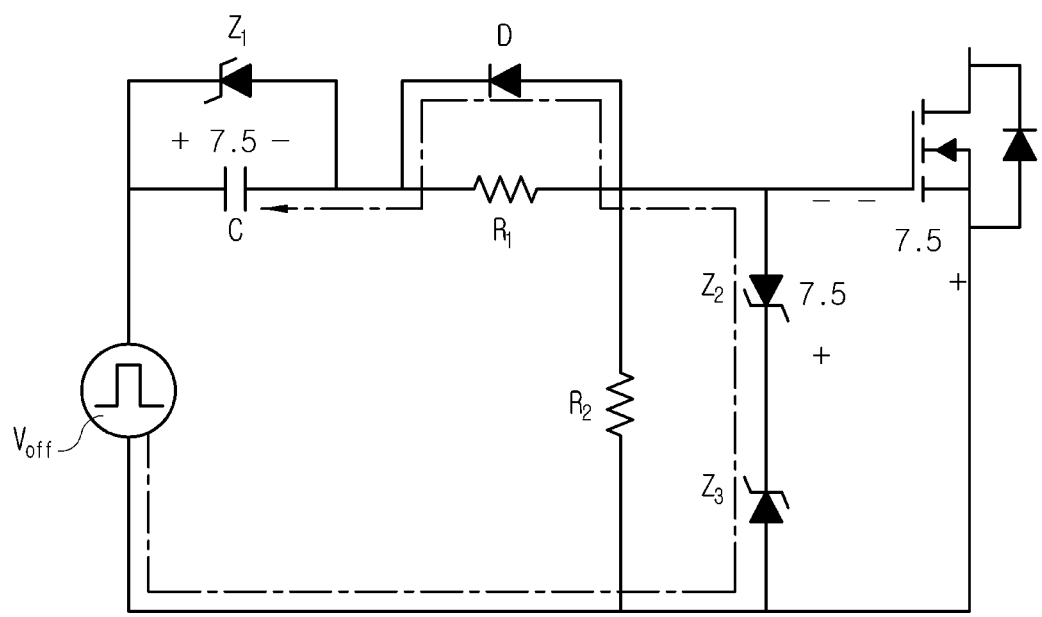
FIG. 7 is a conceptual diagram for providing a negative offset while a first switching device is turned off, according to an embodiment of the present disclosure.

FIG. 5 is a circuit diagram of a switch driving circuit of the first switching device, according to an embodiment of the present disclosure, FIG. 6 is a conceptual diagram for providing a negative offset while the first switching device is turned on, according to an embodiment of the present disclosure, and FIG. 7 is a conceptual diagram for providing a negative offset while the first switching device is turned off, according to an embodiment of the present disclosure.

Although embodiments of a switch driving circuit for the first switching device S1 are described in connection with FIGS. 5 to 7, the embodiments may be equally applied to the second switching device S2 as well.

Referring to FIG. 5, a switch driving circuit in accordance with an embodiment may include a first Zener diode Z1, a capacitor C, a second Zener diode Z2, a third Zener diode Z3, a first resistor R1 a second resistor R2, and a diode D.

The first Zener diode Z1 may be connected to a switch control input end, and the capacitor C may be in parallel connection with the first Zener diode Z1. The first resistor R1 and diode D1 may be connected to the anode of the first Zener diode Z1 and the gate of the first switching device S1. The second resistor R2 may be connected between a point, between the anode of the diode D and gate of the first switching device S1, and the ground. The second and third Zener diodes Z2 and Z3 may be connected between the gate and source of the first switching device S1. The second and third Zener diodes Z2 and Z3 may be in reverse connection to each other.

The Zener diode is a device which allows current to flow in the forward direction under the forward voltage in the same manner as an ordinary diode, but also permits it to flow in the reverse if it is reverse-biased below a voltage lower than for the ordinary diode, i.e., breakdown voltage.

As shown in FIGS. 5 to 7, a negative offset may be applied to the first, second, and third Zener diodes Z1, Z2, and Z3 included in the switch driving circuit for the first switching device S1. Specifically, in the embodiment of the present disclosure, unlike the aforementioned technology, a negative offset may be applied to the circuit based on the switch driving circuit that includes a circuit arrangement 100 with the first Zener diode Z1 and a circuit arrangement 200 with the second and third Zener diodes Z2 and Z3, as shown in FIG. 5. The second and third Zener diodes Z2 and Z3 serve to maintain negative voltage and positive voltage, respectively.

Arrangement of devices and operation of the switch driving circuit for providing a negative offset to the circuit will now be described in detail in connection with FIGS. 6 and 7.

FIG. 6 shows an instance where the first switching device S1 is turned on.

In some embodiments, an input AC voltage Von of 15V may be applied, in which case the first switching device S1 is turned on while the second switching device S2 may be turned off. Current may flow in the direction of the arrow shown in FIG. 6.

Ratings of the first Zener diode Z1 may be differently selected depending on the design of the switch driving circuit, and in FIG. 6, a Zener diode that may be applied with 7.5V will be taken as an example. When 7.5V is applied to the first Zener diode Z1, a capacitor connected in parallel with the first Zener diode Z1 may be charged with the corresponding voltage of 7.5V.

As described above, current may flow through the second and third Zener diodes Z2 and Z3 via the first Zener diode Z1 and first resistor R1. A voltage of 7.5V resulting from subtraction of 7.5V applied across the first Zener diode Z1 from 15V, which is a switch driving voltage applied based on the characteristics of Zener diode, may be applied across the third Zener diode Z3. That is, the third Zener diode Z3 may serve to maintain a positive voltage. Ratings of the third Zener diode Z3 may be selected such that 7.5V may be applied like the ratings of the first Zener diode Z1. Accordingly, a voltage of 7.5V may be applied between the gate and source terminals of the first switching device S1, and as a result, a voltage between the gate and source $V_{gs}$ may be 7.5V although the input voltage to the switch driving circuit is 15V.

As shown in FIG. 6, while the first switching device S1 is turned on, current may flow through the first resistor R1 and the turn-on speed of the first switching device S1 may be controlled by controlling the resistance of the first resistor R1. Furthermore, a level of the voltage applied between the gate and source of the first switching device S1 may be lowered by installing a second resistor R2.

FIG. 7 shows an instance where the first switching device S1 is turned off.

In some embodiments, an input AC voltage $V_{off}$ of 0V may be applied for turn-off, in which case the first switching device S1 is turned off while the second switching device S2 may be turned on. However, as described above, if the first switching device S1 is turned on due to the voltage spikes to the voltage between the gate and source $V_{gs}$ of the first switching device S1 resulting from a rise in the voltage between the drain and source of the first switching device S1, the arm short phenomenon may occur. To avoid this and not to turn on the first switching device S1, a negative offset needs to be applied. When the first switching device S1 is turned off, current flows in the direction of the arrow shown in FIG. 7. That is, the current may flow through the diode D to the capacitor C via the second and third Zener diodes Z2 and Z3.

While the first switching device S1 is turned off, the input AC voltage $V_{off}$ is 0V and the capacitor C has been charged with a voltage of 7.5V that was applied in the turn-on period. Accordingly, −7.5V may be applied to the second Zener diode Z2 and as a result, the voltage of −7.5V may be applied between the gate and source of the first switching device S1. That is, the second Zener diode Z2 may serve to maintain a negative voltage. The second Zener diode Z2 may be selected from among devices having a rating, by which −7.5V may be applied.

As described above, although the input voltage applied to the switch driving circuit is 0V while the first switching device S1 is turned off, the voltage between the gate and source $V_{gs}$ may be −7.5V because of the negative offset provided according to the device design of the switch driving circuit in an embodiment.

Figure 8:
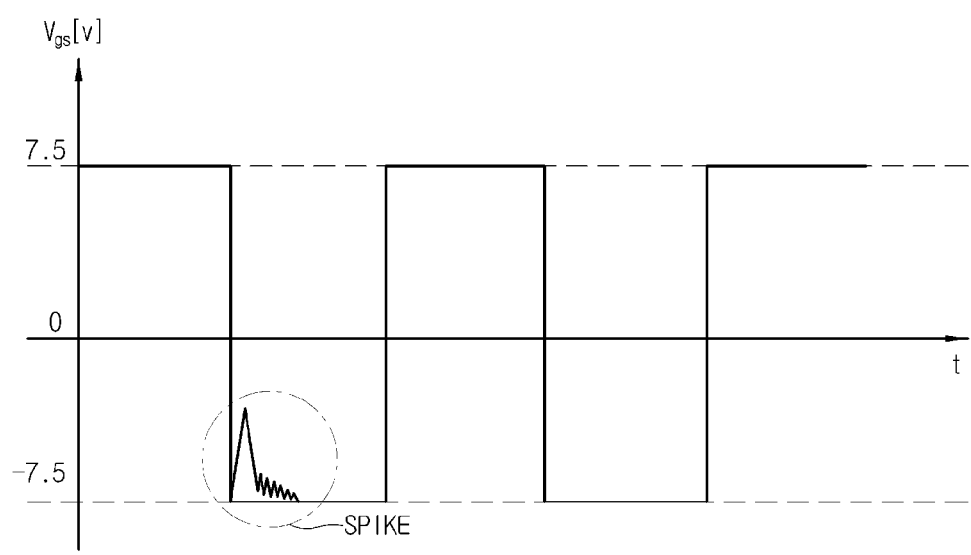
FIG. 8 is a graph showing voltage spikes due to shoot-through current produced in driving a switch in a switch driving circuit to which a negative offset is provided, according to an embodiment of the present disclosure.

FIG. 8 is a graph showing voltage spikes due to shoot-through current produced in driving a switch in a switch driving circuit to which a negative offset is provided, according to an embodiment of the present disclosure.

As shown in FIG. 8, a turn-on voltage of the first switching device S1 is 7.5V and a turn-off voltage is −7.5V. Compared with the graph of FIG. 4 where turn-on and turn-off voltages of the first switching device S1 are 15V and 0V, respectively, without the switch driving circuit configured as in the embodiment of the present disclosure, it may be seen that turn-on and turn-off voltages applied between the gate and source of the first switching device S1 are each reduced by 7.5V if the negative offset is provided by using the first, second, and third Zener diodes Z1, Z2, and Z3 in the embodiment of the present disclosure.

As shown in FIG. 8, where a turn-off voltage applied between the gate and source of the first switching device S1 is −7.5V, even if the voltage spikes occur as described in connection with FIGS. 3 and 4, it does not exceed 0V, a threshold voltage of the first switching device S1, thereby preventing malfunctions of the first switching device S1 due to the voltage spike. Accordingly, arm short may not occur because the first and second switching devices S1 and S2 are not turned on at the same time.

The switch driving circuit in the embodiment as described in connection with FIGS. 5 to 8 may be applied to the first switching device S1 or second switching device S2 of the totem-pole bridgeless PFC circuit shown in FIG. 1. In other words, the arm short phenomenon of the totem-pole bridgeless PFC circuit may be avoided by providing a negative voltage offset to prevent malfunctions of the switching device.

The totem-pole PFC circuit including the switch driving circuit in accordance with the embodiment of the present disclosure may be generally used in majority of electronic products, such as single-phase consumer appliance systems including air conditioners, display driving systems, etc. Accordingly, electronic products including the totem-pole PFC circuit may enable highly efficient PFC and prevent damages to the circuit due to malfunctions caused by voltage spikes in driving a switch.

Embodiments of a switch driving circuit and PFC circuit including the same were described with reference to accompanying drawings. However, the examples of the switch driving circuit and PFC circuit including the same are not limited thereto, and the aforementioned embodiments are exemplary in all aspects.

According to embodiments of the present disclosure, malfunctions of a switch being inadvertently turned on from a turn-off state may be avoided by providing a negative offset using a Zener diode. Furthermore, high efficiency of a circuit and reduction in energy loss may be secured by configuring a totem-pole power factor correction circuit implemented with gallium nitride (GaN) Field Effect Transistors (FETs).

Several embodiments have thus been described, but it will be understood that various modifications can be made without departing the scope of the present disclosure. Thus, it will be apparent to those ordinary skilled in the art that the disclosure is not limited to the embodiments described, but can encompass not only the appended claims but the equivalents.

What is claimed is:

1. A switch driving circuit to operate a field effect transistor, the switch driving circuit comprising:
   a first Zener diode having an anode connected to a gate of the field effect transistor;
   a capacitor connected in parallel with the first Zener diode; and
   second and third Zener diodes configured to provide a negative offset to fix a voltage applied between the gate and a source of the field effect transistor to a negative value.

2. The switch driving circuit of claim 1, wherein the second and third Zener diodes are connected to each other in a back-to-back arrangement connected between the gate and the source of the field effect transistor.

3. The switch driving circuit of claim 2, wherein the first Zener diode is configured to charge the capacitor with a voltage of a level that corresponds to ratings of the first Zener diode based on a level of a switch driving voltage to turn on the field effect transistor.

4. The switch driving circuit of claim 3, wherein the third Zener diode has ratings such that when the field effect transistor is turned on, a voltage, of a level that is the level of the switch driving voltage subtracted by a voltage of the level corresponding to the ratings of the first Zener diode, is applied between the gate and source.

5. The switch driving circuit of claim 1, wherein when the field effect transistor has received a turn-off signal, the capacitor remains charged with a voltage of a level corresponding to the ratings of the first Zener diode.

6. The switch driving circuit of claim 5, wherein the second Zener diode has ratings such that when the field effect transistor is turned off, a voltage corresponding to the level of a charged voltage in the capacitor provides a negative offset fixed to a negative value between the gate and source.

7. The switch driving circuit of claim 1, further comprising:
a first resistor connected in series to the anode of the first Zener diode and to the gate of the field effect transistor to control turn-on speed of the field effect transistor; and
a diode connected in series to the anode of the first Zener diode and to the gate of the field effect transistor to control turn-off speed of the field effect transistor.

8. The switch driving circuit of claim 7, further comprising:
a second resistor connected between ground and a point between the anode of the diode and the gate of the field effect transistor, to lower the voltage between the gate and source.

9. The switch driving circuit of claim 1, wherein the field effect transistor is a gallium oxide (GaN) field effect transistor.

10. A totem-pole power factor correction circuit for converting an Alternate Current (AC) voltage to a Direct Current (DC) voltage, the totem-pole power factor correction circuit comprising:
a field effect transistor;
a first Zener diode having an anode connected to a gate of the field effect transistor;
a capacitor connected in parallel with the first Zener diode; and
second and third Zener diodes configured to provide a negative offset to fix a voltage applied between the gate and a source of the field effect transistor to a negative value.

11. The totem-pole power factor correction circuit of claim 10, the second and third Zener diodes are connected to each other in a back-to-back arrangement connected between the gate and the source of the field effect transistor.

12. The totem-pole power factor correction circuit of claim 11, wherein the first Zener diode is configured to charge the capacitor with a voltage of a level that corresponds to ratings of the first Zener diode based on a level of a switch driving voltage to turn on the field effect transistor.

13. The totem-pole power factor correction circuit of claim 12, wherein the third Zener diode has ratings such that when the field effect transistor is turned on, a voltage, of a level that is the level of the switch driving voltage subtracted by a voltage of the level corresponding to the ratings of the first Zener diode, is applied between the gate and source.

14. The totem-pole power factor correction circuit of claim 10, wherein when the field effect transistor has received a turn-off signal, the capacitor remains charged with a voltage of a level corresponding to the ratings of the first Zener diode.

15. The totem-pole power factor correction circuit of claim 14, wherein the second Zener diode has ratings such that when the field effect transistor is turned off, a voltage corresponding to the level of a charged voltage in the capacitor provides a negative offset fixed to a negative value between the gate and source.

16. The totem-pole power factor correction circuit of claim 10, further comprising:
a first resistor connected in series to the anode of the first Zener diode and to the gate of the field effect transistor to control turn-on speed of the field effect transistor; and
a diode connected in series to the anode of the first Zener diode and to the gate of the field effect transistor to control turn-off speed of the field effect transistor.

17. The totem-pole power factor correction circuit of claim 16, further comprising:
a second resistor connected between ground and a point between the anode of the diode and the gate of the field effect transistor , to lower the voltage between the gate and source.

18. The totem-pole power factor correction circuit of claim 10,
wherein the field effect transistor is a gallium nitride (GaN) field effect transistor.

19. An electronic product using the totem-pole power factor correction circuit of claim 10.

20. A switch driving circuit comprising:
a field effect transistor;
an AC voltage source having a first terminal and a second terminal;
a first Zener diode connected to the first terminal of the AC voltage source and having an anode connected to a gate of the field effect transistor;
a capacitor connected in parallel with the first Zener diode;
a second Zener diode having an anode connected to the gate of the field effect transistor; and
a third Zener diode having an anode connected to a source of the field effect transistor and to the second terminal of the AC source, and having a cathode connected to a cathode of the second Zener diode.

21. The switch driving circuit of claim 20, further comprising:
a resistor connected between the anode of the first Zener diode and the gate of the field effect transistor;
a fourth diode connected between the anode of the first Zener diode and the gate of the field effect transistor, and connected in parallel with the resistor, the fourth diode having a higher resistance than that of the resistor for an on current flowing from the anode of the first Zener diode to the gate of the field effect transistor.

22. The switch driving circuit of claim 20, further comprising:
a second resistor connected between the anode of the second Zener diode and the anode of the third Zener diode.

23. The switch driving circuit of claim 20, wherein when the field effect transistor has been switched from on to off, a negative voltage is applied to the third Zener diode and a negative voltage is applied between the gate and the source of the field effect transistor.

* * * * *